(12) United States Patent
Baliarda et al.

(10) Patent No.: US 8,593,360 B2
(45) Date of Patent: *Nov. 26, 2013

(54) SLOTTED GROUND-PLANE USED AS A SLOT ANTENNA OR USED FOR A PIFA ANTENNA

(75) Inventors: Carles Puente Baliarda, Barcelona (ES); Jaime Anguera Pros, Castellon (ES)

(73) Assignee: Fractus, S.A., Sant Cugat del Valles (ES)

( * ) Notice: Subject to any disclaimer, the term of this patent is extended or adjusted under 35 U.S.C. 154(b) by 0 days.

This patent is subject to a terminal disclaimer.

(21) Appl. No.: 13/336,127

(22) Filed: Dec. 23, 2011

(65) Prior Publication Data

US 2012/0092226 A1   Apr. 19, 2012

Related U.S. Application Data

(63) Continuation of application No. 12/958,522, filed on Dec. 2, 2010, now Pat. No. 8,111,199, which is a continuation of application No. 11/884,991, filed as application No. PCT/EP2006/060766 on Mar. 15, 2006, now Pat. No. 7,872,605.

(30) Foreign Application Priority Data

Mar. 15, 2005   (EP) .................................. 05005540

(51) Int. Cl.
   *H01Q 13/10*   (2006.01)
   *H01Q 1/38*   (2006.01)
(52) U.S. Cl.
   USPC ..................... 343/767; 343/700 MS; 343/702

(58) Field of Classification Search
   USPC .................. 343/700 MS, 702, 767, 846, 848
   See application file for complete search history.

(56) References Cited

U.S. PATENT DOCUMENTS

| | | |
|---|---|---|
| 4,141,014 A | 2/1979 | Sletten |
| 5,268,696 A | 12/1993 | Buck |
| 5,608,413 A | 3/1997 | Macdonald |
| 5,777,581 A | 7/1998 | Lilly |

(Continued)

FOREIGN PATENT DOCUMENTS

| | | |
|---|---|---|
| CA | 2416437 | 1/2002 |
| EP | 0548975 | 6/1993 |

(Continued)

OTHER PUBLICATIONS

Abedin, M. F. Modifying the ground plane and its effect on planar inverted-F antennas (PIFAs) for mobile phone handsets. Antennas and Wireless Propagation Letters, IEEE. vol. 2. Jan. 1, 2003.

(Continued)

*Primary Examiner* — Tan Ho
(74) *Attorney, Agent, or Firm* — Winstead PC

(57) ABSTRACT

A wireless device includes a ground plane with at least two portions. On each of the at least two portions at least one connecting means is provided. The two connecting means are connected with an electric component for connecting the at least two portions of the ground plane. The ground plane is partially covered with an insulating material and the connecting means are given by a part of the ground plane which is not covered by any insulating material.

20 Claims, 6 Drawing Sheets

(56) References Cited

U.S. PATENT DOCUMENTS

| | | | |
|---|---|---|---|
| 5,903,822 | A | 5/1999 | Sekine |
| 6,002,367 | A | 12/1999 | Engblom |
| 6,008,764 | A | 12/1999 | Ollikainen |
| 6,140,975 | A | 10/2000 | Cohen |
| 6,239,762 | B1 | 5/2001 | Lier |
| 6,239,765 | B1 | 5/2001 | Johnson |
| 6,307,519 | B1 | 10/2001 | Livingston |
| 6,314,273 | B1 | 11/2001 | Matsuda |
| 6,348,892 | B1 | 2/2002 | Annamaa |
| 6,377,217 | B1 | 4/2002 | Zhu |
| 6,388,620 | B1 | 5/2002 | Bhattacharyya |
| 6,388,631 | B1 | 5/2002 | Livingston |
| 6,414,637 | B2 | 7/2002 | Keilen |
| 6,462,710 | B1 | 10/2002 | Carson |
| 6,466,176 | B1 | 10/2002 | Mahoz |
| 6,476,769 | B1 | 11/2002 | Lehtola |
| 6,498,586 | B2 | 12/2002 | Pankinaho |
| 6,538,603 | B1 | 3/2003 | Chen |
| 6,717,551 | B1 | 4/2004 | Desclos |
| 6,756,939 | B2 | 6/2004 | Chen |
| 6,911,939 | B2 | 6/2005 | Carson |
| 6,985,108 | B2 | 1/2006 | Mikkola |
| 7,586,414 | B2 | 9/2009 | Kai |
| 7,696,927 | B2 | 4/2010 | Bae |
| 7,872,605 | B2 * | 1/2011 | Baliarda et al. ......... 343/700 MS |
| 7,932,863 | B2 * | 4/2011 | Pros et al. ...................... 343/702 |
| 8,111,199 | B2 * | 2/2012 | Baliarda et al. ......... 343/700 MS |
| 2003/0071763 | A1 | 4/2003 | McKinzie |
| 2003/0122721 | A1 | 7/2003 | Sievenpiper |
| 2003/0193437 | A1 | 10/2003 | Kangasvieri |
| 2004/0017318 | A1 | 1/2004 | Annabi |
| 2004/0058723 | A1 | 3/2004 | Mikkola |
| 2004/0155823 | A1 | 8/2004 | Kossiavas |
| 2004/0217916 | A1 | 11/2004 | Quintero |
| 2005/0110690 | A1 | 5/2005 | Ko |
| 2005/0237251 | A1 | 10/2005 | Boyle |
| 2007/0040751 | A1 | 2/2007 | Boyle |
| 2008/0074332 | A1 | 3/2008 | Arronte et al. |

FOREIGN PATENT DOCUMENTS

| | | |
|---|---|---|
| EP | 0892459 | 1/1999 |
| EP | 1837950 | 9/2001 |
| EP | 1401050 | 3/2004 |
| GB | 2391114 | 1/2001 |
| JP | 2005012516 | 1/2005 |
| WO | 92/05152 A2 | 4/1992 |
| WO | 96/27219 | 9/1996 |
| WO | 0030211 | 5/2000 |
| WO | 0122528 | 3/2001 |
| WO | 0154225 | 7/2001 |
| WO | 0189031 | 11/2001 |
| WO | 0229929 | 4/2002 |
| WO | 02/35652 | 5/2002 |
| WO | 03023900 | 3/2003 |
| WO | 03034544 | 11/2003 |
| WO | 03096475 | 11/2003 |
| WO | 04001894 | 12/2003 |
| WO | 2004013933 | 2/2004 |
| WO | 2004102744 | 11/2004 |
| WO | 2006031170 | 3/2006 |
| WO | 2006032455 | 3/2006 |
| WO | 2006070017 | 7/2006 |
| WO | 2006120250 | 11/2006 |

OTHER PUBLICATIONS

Anguera, J.; Boada, Li.; Puente, C.; Borja, C.; Soler, J. Stacked H-shaped microstrip patch antenna.Antennas and Propagation, IEEE Transactions on. Apr. 1, 2004.

Anguera, J.; Cabedo, A.; Picher, C.; Sánchez, I.; Ribó, M.; Puente, C. Multiband handset antennas by means of groundplane modification.Antennas and Propagation Society International Symposium, 2007 IEEE. Jun. 10, 2007.

Anguera, J.; Sanz, I.; Mumbru, J.; Puente, C. Multiband handset antenna behaviour by combining PIFA and slot radiators.Antennas and Propagation Society International Symposium, 2007 IEEE. Jul. 1, 2007.

Anguera, J.; Sanz, I.; Sanz, A.; Gala, D.; Condes, A.; Puente, C.; Soler, J. Enhancing the performance of handset antennas by means of groundplane design.IEEE International Workshop on Antenna Technology (IWAT) Small Antennas and Novel Metamaterials. Mar. 6, 2006.

Bedair, Adel; Abdel-Mooty Abdel-Rahman, A. B. Design and development of high gain wideband microstrip antenna and DGS filters using numerical experimentation approach.Fakultat Elektrotechnik and Informationstechnik der Otto-von-Guericke-Universitat Magdeburg. Jun. 1, 2005.

Cabedo, A. Antenas multibanda para aplicaciones 2G, 3G, WIFI, WLAN y Bluetooth en terminales móviles de nueva generación. Fractus & La Salle. Jan. 1, 2001.

Cetiner, B. A. et al. A packaged reconfigurable multielement antenna for wireless networking.Microwave Conference, 2001. APMC 2001. 2001 Asia-Pacific. 2 pp. 705-708. Jan. 1, 2001.

Chen, Zhi Ning, et al Reduction in antenna height by slotting ground plane.IWAT. Mar. 6, 2006.

Chiou, Tzung-Wern et al. Designs of compact microstrip patch antennas with a slotted ground plane.Antennas and Propagation Society International Symposium, 2001. IEEE. Jul. 8, 2001.

Chu, L. J. Physical limitations of omni-directional antennas.Journal of applied physics. Dec. 1, 1948.

Du, Z.; Gong, K. et al. A compact planar inverted-F antenna with a PBG-type ground plane for mobile communications.IEEE Transactions on Vehicular Technology. May 1, 2003.

Ferrero, F. et al Dual-band circularly polarized microstrip antenna for satellite applications.Antennas and Wireless Propagation Letters, IEEE. Jan. 1, 2005.

Hansen, R. C. Fundamental limitations in antennas.IEEE Proceedings. vol. 69 No. 2pp. 170-182. Feb. 1, 1981.

Hong, J. S. et al Aperture-coupled microstrip open-loop resonators and their applications to the design of novel microstrip bandpass filters.Microwave Theory and Techniques, IEEE Transactions on. Sep. 1, 1999.

Hossa, R. et al. Improvement of compact terminal antenna performance by incorporating open-end slots in ground plane.Microwave and Optical Technology Letters. vol. 14 No. 6. Jun. 1, 2004.

Huang, C.; Wu, Jian-Yi; Wong, Kin-Lu Cross slot coupled microstrip antenna and dielectric resonator antenna for circular polarization.Antennas and Propagation, IEEE Transactions on. Apr. 1, 1999.

Huang, C. et al. Dielectric resonator antenna on a slotted ground plane.Antennas and Propagation Society International Symposium, 2001. IEEE. Jul. 8, 2001.

Huang, C. et al. Slotted ground plane for frequency tunable dielectric resonator antenna.Microwave and Optical Technology Letters. vol. 35 No. 3pp. 193-195. Nov. 5, 2002.

Kabacik, P. Potential advantage of using non rectangular ground in small antennas featuring wideband impedance match.Antennas and Propagation Society International Symposium, 2007 IEEE. May 1, 2007.

Kabacik, P. et al. Broadening the bandwidth in terminal antennas by tuning the coupling between the element and its ground.Antennas and Propagation Society International Symposium, 2005. IEEE. vol. 3. Jul. 3, 2005.

Karaboikis, M. et al Compact dual-printed inverted-F antenna diversity systems for portable wireless devices.Antennas and Wireless Propagation Letters, IEEE. vol. 3. Jan. 1, 2004.

Ke, S. Broadband proximity-coupled microstrip antennas with an H-shaped slot in the ground plane.Antennas and Propagation Society International Symposium, 2002. IEEE. Jun. 16, 2002.

Kim, J. et al. Design of wideband microstrip array antennas using the coupled lines.Antennas and Propagation Society International Symposium, 2000. IEEE. Jul. 16, 2000.

Kim, T. et al. Design of a wideband microstrip array antenna for PCs and IMT-2000 service.Microwave and Optical Technology Letters. vol. 30 No. 4. Aug. 20, 2001.

(56) References Cited

OTHER PUBLICATIONS

Kivekas, O. et al. Design of high-efficiency antennas for mobile communications devices.University of Technology of Helsinki. Aug. 1, 2005.
Kumar, G. Broadband microstrip antennas.Artech House. p. 424. Jan. 1, 2003.
Kyriacou, G. A. et al. A design procedure for aperture coupled microstrip antennas based on approximate equivalent networks.Microwave and Optical Technology Letters. Sep. 24, 2002.
Lindberg, P. et al. Wideband active and passive antenna solutions for handheld terminals.Acta Universitatis Upsaliensis Uppsala. Jan. 1, 2007.
Lu, Jui Han Slot-coupled small triangular microstrip antenna.Microwave and Optical Technology Letters. Dec. 20, 1997.
Lu, Jui-Han; Yang, Kai-Ping Slot coupled compact triangular microstrip antenna with lumped load.Antennas and Propagation Society International Symposium, 1998. AP-S. Digest. Jun. 21, 1998.
Manteuffel, Dirk; Bahr, Achim; Wolff, Ingo Investigation on integrated antennas for GSM mobile phones.AP2000, Davos, Conference. Apr. 1, 2000.
Moretti, P. et al. Numerical investigation of vertical contacless transitions for multilayer RF circuits.Microwave Symposium Digest, 2001 IEEE MTT-S International. May 20, 2001.
Noguchi, K. A broadband plate antenna with slits.Antennas and Propagation Society International Symposium, 1999. IEEE. Jul. 29, 1999.
Öjefors, E. Micromachined antennas for integration with silicon base active devices.Uppsala University, Sweden. Mar. 29, 2004.
Okabe, H. et al Tunable antenna system for 1.9-GHz PCS handsets. Antennas and Propagation Society International Symposium, 2001. IEEE. Jul. 8, 2001.
Ollikainen, J. et al. Design and implementation techniques of wideband mobile communications antennas.Helsinki University of Technology. Nov. 1, 2004.
Ottosen, D. Wideband aperture-fed patch antenna element.TEAT. Nov. 1, 2004.
Panaia, P. MEMS-Based reconfigurable antennas.IEEE International Symposium on Industrial Electronics, 2004. May 7, 2004.
Paschen, D. A. Structural stopband elimination with the monopole-slot antenna.Antenna Applications Symposium. Sep. 22, 1982.
Ping Zhao, A. et al Quarter-wavelength wideband slot antenna for 3-5 GHz mobile applications.Antennas and Wireless Propagation Letters, IEEE. vol. 4 . Sep. 1, 2005.
Pozar, David M. A review of aperture coupled microstrip antennas—History, operation, development and applications. University of Massachussetts at Amherst. May 1, 1996.
Shum, K. M. et al. Design of small antennas for joypad applications. IWAT. Mar. 6, 2006.
Virga, K. L. Low-profile enhanced-bandwidth PIFA antennas for wireless communications packaging.Microwave Theory and Techniques, IEEE Transactions on. vol. 45 . Oct. 10, 1997.
Wheeler, H. A. Fundamental limitations of small antennas.Proceedings of the I.R.E. Jan. 1, 1947.
Wong, Kin-Lu Compact and broadband microstrip antennas.John Wiley and Sons Inc. Jan. 1, 2002.
Wong, Kin-Lu Planar antennas for wireless communications_Full. Wiley Interscience. Jan. 1, 2003.
Yang, Fan et al Slitted small microstrip antenna.Antennas and Propagation Society International Symposium, 1998. AP-S. Digest. Jun. 21, 1998.
Yang, Fan et al. Patch antenna with switchable slots (PASS): reconfigurable design for wireless communications. Antennas and Propagation Society International Symposium, 2002. IEEE. Jan. 1, 2002.
Yang, X. H.; Shafai, L. Multifrequency operation technique for aperture coupled microstrip antennas.Antennas and Propagation Society International Symposium, 1994. AP-S. Digest. Jun. 20, 1994.
Yoon, Ick-Jae et al. Frequency tunable antenna for mobile TV signal reception.Antennas and Propagation Society International Symposium 2007, IEEE. Feb. 1, 2007.
Jaggard, D. L. Expert report of Dwight L. Jaggard (redacted)—expert witness retained by Fractus.Fractus. Feb. 23, 2011.
Jaggard, D. L. Rebuttal expert report of Dr. Dwight L. Jaggard (redacted version).Fractus. Feb. 16, 2011.
Long, S. Rebuttal expert report of Dr. Stuart A. Long (redacted version).Fractus. Feb. 16, 2011.
Chen, S. C. Notice of Allowance of U.S. Appl. No. 11/884,991 dated Oct. 28, 2010.
Chen, S. C. Office Action of U.S. Appl. No. 11/884,991 dated on Jun. 16, 2010.
Duong, D. Notice of Allowance of U.S. Appl. No. 11/793,406 dated Nov. 12, 2010.
Duong, D. Notice of Allowance of U.S. Appl. No. 11/793,406 dated Oct. 5, 2010.
Duong, D. Office Action for U.S. Appl. No. 11/793,406 dated on Apr. 15, 2010 USPTO. Apr. 20, 2010.
Mithani, S. Response to Office Action dated Jun. 16, 2010 of U.S. Appl. No. 11/884,991.Winstead. Oct. 8, 2010.
Mithani, S. Response to the Office Action for the U.S. Appl. No. 11/793,406 dated on Apr. 15, 2010.Winstead PC. Jul. 13, 2010.
Owens, Douglas W. Notice of allowance for the U.S. Appl. No. 11/793,406 dated on Jan. 6, 2011.
Mithani, S. A. Amendment in response to non-final office action dated on Feb. 25, 2011 for U.S. Appl. No. 12/958,522.Fractus. May 24, 2011.
Notice of allowance of U.S. Appl. No. 12/958,522 dated on Jul. 8, 2011.
Notice of allowance of U.S. Appl. No. 12/958,522 dated on Nov. 14, 2011.
Chen, S. C. Office Action for the U.S. Appl. No. 12/958,522 dated on Feb. 25, 2011.
Anguera, J. Sanz, I. Sanz, A. et al. Multiband PIFA handset antenna by means of groundplane designs. IEEE Antennas and Propagations Symposium. 2006.
Maci, S. and Biffi, G. Dual frequency patch antennas. IEEE Antennas and Propagation Magazine, vol. 39, No. 6. Dec. 1997.
Sanad, M. A very small double c-patch antenna contained in a PCMCIA standard PC card. IEE Conference of Antennas and Propagation. No. 407. Apr. 1995.
Wong, K. L. Planar antennas for wireless communications. Wiley Series, 2003. pp. 1-49.
Karmakar, N. C. Frequency tuning of a dual-band dual-feed Pifa antenna for future mobile communications. Microwave and Optical Technology Letters. vol. 31, No. 5. Dec. 5, 2001.

\* cited by examiner

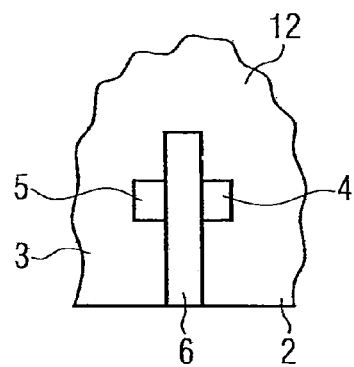
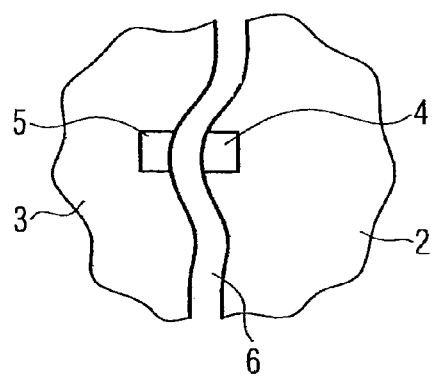
FIG. 3a
FIG. 3b
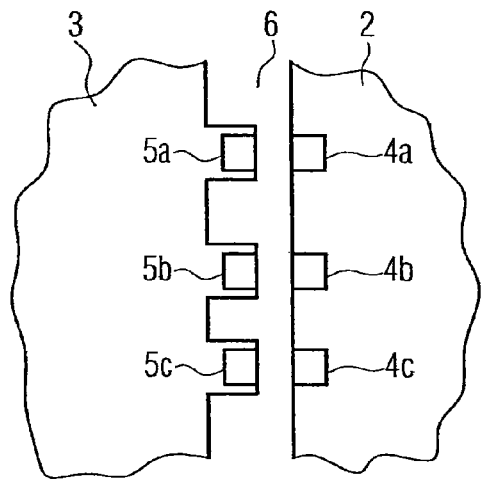
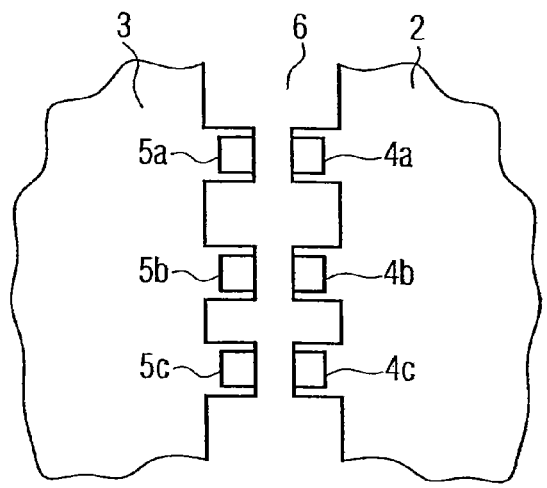
FIG. 3c
FIG. 3d
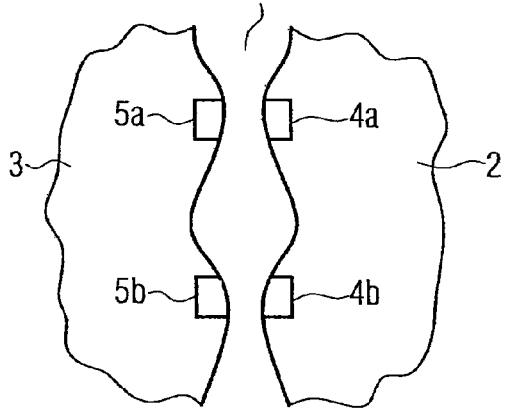
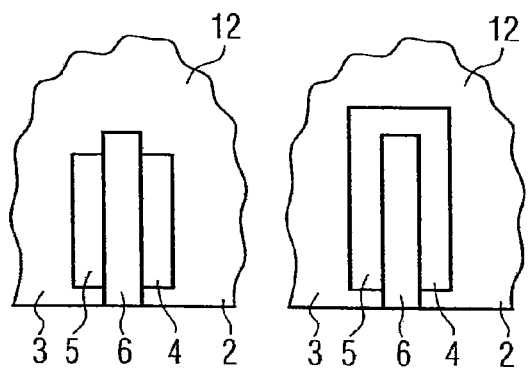
FIG. 3e
FIG. 3f
FIG. 3g

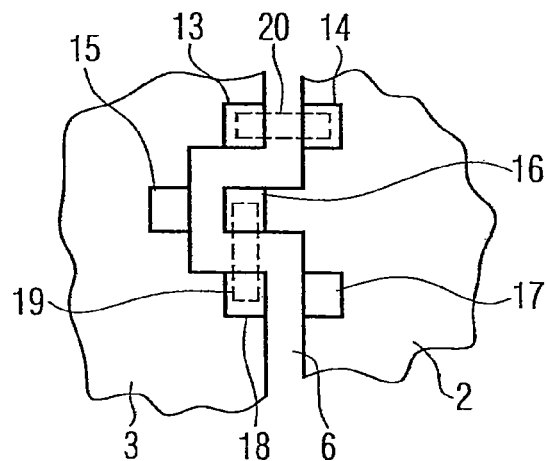
FIG. 4
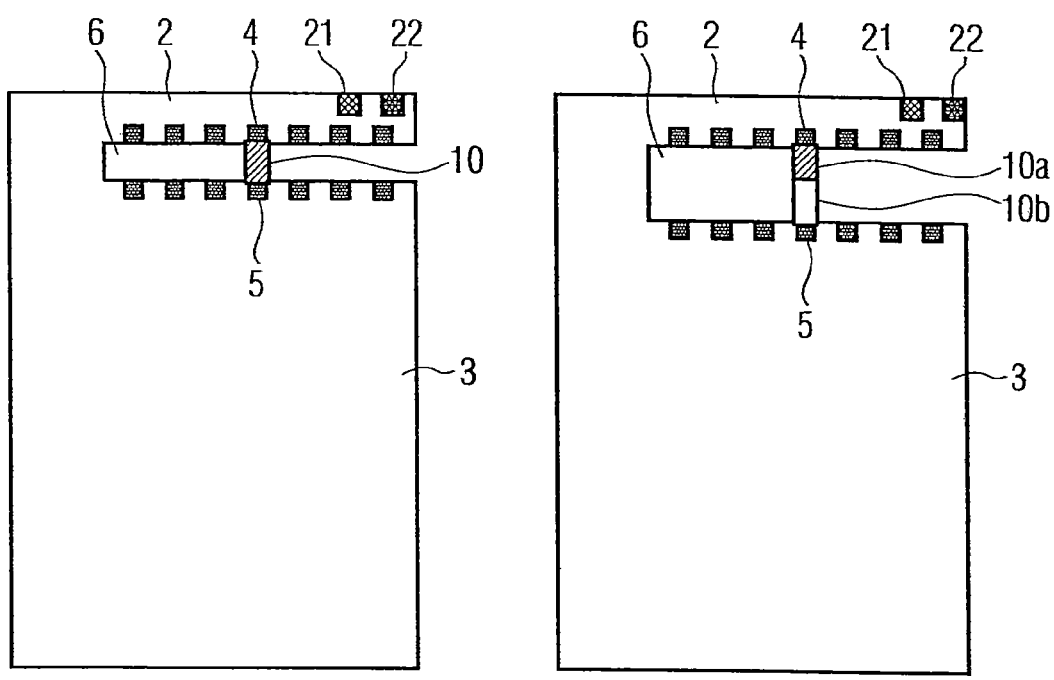
FIG. 5
FIG. 6

SLOTTED GROUND-PLANE USED AS A SLOT ANTENNA OR USED FOR A PIFA ANTENNA

CROSS-REFERENCE TO RELATED APPLICATIONS

This patent application is a continuation application of U.S. patent application Ser. No. 12/958,522, filed on Dec. 2, 2010 now U.S. Pat. No. 8,111,199. U.S. patent application Ser. No. 12/958,522, is a continuation application of U.S. patent application Ser. No. 11/884,991 filed Sep. 20, 2007 now U.S. Pat. No. 7,872,605. U.S. patent application Ser. No. 11/884,991 is a national-stage filing of International Patent Application No. PCT/EP2006/060766. International Patent Application No. PCT/EP2006/060766 was filed on Mar. 15, 2006. International Patent Application No. PCT/EP2006/060766 claims priority from European Patent Application EP 05005540.9, which was filed on Mar. 15, 2005. U.S. patent application Ser. No. 12/958,522, U.S. patent application Ser. No. 11/884,991, International Patent Application No. PCT/EP2006/060766, and EP 05005540.9 are incorporated herein by reference.

BACKGROUND OF THE INVENTION

History of Related Art

Shaping the ground-plane of a wireless communication device (such as for instance a mobile phone, a smart phone, a PDA, an MP3 player, headset, USB dongle, laptop, PCMCIA or Cardbus 32 card) has been shown to be a useful technique to improve the radiation characteristics of such a device. This has been for instance disclosed in WO 03 023900. In several examples of the prior-art, at least a portion of such a shaped ground-plane includes a slot separating totally or partially at least two conducting regions on said ground-plane. Further there are several known antenna systems for wireless devices where the radiating antenna element is just a slot provided in the wireless device's ground plane. Usually such a ground-plane is embedded in a multilayer printed circuit board (PCB) which hosts the electronics and other components (for instance integrated circuits, batteries, handset-camera and speakers, LCD screens, vibrators) of the whole device. In these cases, the desired shape for the ground-plane can be cost effectively implemented by using conventional PCB manufacturing techniques.

One of the problems of placing the slot on such a PCB is to make the fine tuning of the frequency response of such a slot, and generally the whole ground-plane. Although several electromagnetic CAD tools can approximately model the response of the geometry, usually the final design is tuned experimentally. This involves an iterative process where several PCBs are to be prototyped and produced before closing the final PCB design. This is a costly process, which in turn might delay the commercial launching of the project.

On the other hand, embedding a slot in the ground-plane some times is difficult due to the size of the slot and space constrains. If a multiband response of the slot is desired, then usually the shape of the slot involves several branches with several characteristic lengths that can fit the multiple wavelengths. In this later case, again the space is a constraint that can make the solution impractical or unfeasible.

SUMMARY OF THE INVENTION

The object of the present invention is to provide a member for a wireless device and/or a wireless device with a ground plane which allows for an improved design process of wireless devices.

This problem is solved with the member of claim 1 and with the wireless device as of claim 16, 17 and/or 19.

The member for the wireless device is or comprises a ground plane with at least two portions. Those two portions are preferably separated by a gap or slot or any other non-conducting part. On each of said portions a connecting means is provided such as a pad or any other connecting means such as a pin, a solder ball or the like. The connecting means are provided such that they can be connected with an electric component. With this electric component the two portions of the ground plane are connectable.

The member may be e.g. a PCB with the ground plane. The ground plane may be an outer layer of the PCB. In case that said PCB is a multilayer board (with multiple conductive layers separated by insulating layers) the outer ground layer shields inner layers. The ground plane may also be provided as an inner layer of a multilayer PCB.

The connecting means are arranged such that an electric component mounted thereon bridges over a non-conducting area.

In this way, it is possible to change the electric characteristics of the ground plane without, however, reshaping the ground plane. The design of the ground plane may therefore be closed while it is still possible to electrically change the ground plane in order to provide improved radiation characteristics.

The two portions of the ground plane may be connected through the ground plane itself such as by a third portion of the ground plane. They may, however, also be disconnected as long as no electric component is connecting the two portions.

The connecting means may have a size such that only one electric component may be connected thereon. The connecting means, however, may also be shaped such that more than one electric component can be provided thereon. The connecting means may e.g. extend without any discontinuity at least along one fifth, fourth, third or half or two thirds, three fourth, three fifth, four fifth or along the entire of the length of one edge of a slot or gap. The two connecting means may also be given by two joint parts of a connecting means which extends around an end of a slot, such that one uninterrupted portion of the connecting means is provided on both sides of the slot. Then it is still possible to bridge the slot by an electric component. The connecting means may also extend continuously all along the edge of a slot such that the two connecting means are given by two parts on different sides of a slot.

The ground plane may for example comprise a slot and the two portions are provided on different sides of the slot. The slot may penetrate all through the ground plane or may only partially penetrate into the ground plane. In the latter case, the two portions are still connected by a third portion of the ground plane, while if the slot penetrates all through the ground plane, the two portions are not connected by another portion of the ground plane.

The slot may have only one part. The slot may also comprise several parts such as two, three or more parts. One part may branch off another part and one, two, three or more parts branching off another part may be given.

The slot may be given in order to enhance radiation characteristics of the wireless device. The slot length may define an operating frequency and/or the slot may be electromagnetically coupled to an antenna element in order to improve the radiation characteristics of the antenna element and therefore of the antenna system as a whole. The electric component may be provided for fine tuning the electric characteristics of the slot and/or ground plane. It may also be provided to define the basic electric characteristics of the slot e.g. by a short circuit element. In this case an additional electric component may be provided in order to fine tune the electric properties of the slot and/or ground plane.

The connecting means are preferably provided around the edges of the slot. This means that they are located at the edge of the slot and are distributed around the border of the slot. They may be provided directly at the edge or also a little bit separated from the edge. Further, they may be evenly distributed at least on one side or on two sides of the slot along the length of the slot, but they may also be unevenly distributed at least on some portions of the edge of the slot.

One, both or each of the portions of the ground plane may have multiple connecting means such as more than two, three, four, five, seven, ten, fifteen, twenty, thirty, forty or fifty connecting means or less than any of those given numbers. This allows for more flexibility when changing the electric characteristics of the ground plane by connecting the electric component(s).

The ground plane, furthermore, has one, two, three or more connecting means for connecting the ground plane to a feeding and/or radiating element. In some antenna configurations the radiating element may e.g. be short-connected to the ground plane.

The member preferably comprises an insulating material which is partially covering the ground plane. With this insulating material it is possible to define the connecting means by leaving part of the ground plane uncovered. In this way it is easily and cheaply possible to define the different connecting means. The insulating material may be e.g. a paint, a coating, a foil and can be made of e.g. a resin.

The insulating material is preferably further provided such that it is present between different connecting means such that they are clearly separated. This allows for well defined locations of the connecting means such that if the electric component is provided on the connecting means at slightly different positions due to production tolerances, then the portions of the ground plane which are connected are, however, still clearly defined. Thereby it is possible to avoid a major dependence on the electric characteristics of the ground plane due to fabrication tolerances in the exact location of the electric component.

The connecting means may, however, also be given by a pad that is connected to the ground plane with a via, that extends into a multilayer PCB. In this case the ground plane is provided as an inner conductive layer.

The electric component may e.g. be a resistor, a short circuit element, a capacitor, a conductor, a filter, a diode, a transistor, a switch or any other radio frequency device as explained in more detail below.

The connection between the different portions may be established by more than one electric component e.g. by two, three or more electric components. Two or three or more of those components may be arranged in series and/or parallel. Further, the electric components may be the same, different or some of them may be the same or different. This allows for very increased flexibility in adapting the electric properties of the ground plane.

The ground plane may be coupled to one or more antenna elements. The coupling may be by direct electric connection or by coupling with electric/electromagnetic fields through a separation between the antenna element/antenna elements and the ground plane. In a preferred mode, the antenna element is an inverted F antenna (IFA) or, more preferably, a planar inverted F antenna (PIFA). The antenna may be a patch antenna since this allows for a compact design of the wireless device.

The connecting means and the antenna element may be provided on the same side or on different sides of the ground plane/PCB.

Preferably, the slot is placed substantially close to the antenna element such that the coupling between the slot and the antenna element is enhanced. Preferably the slot would be placed at a location which is provided by an orthogonal projection of the antenna onto the ground plane. Preferably, the slot is provided substantially aligned with an edge of the antenna and/or of the ground plane.

A feeding terminal and a shorting terminal of said antenna element(s) may be provided on the same portion of the ground plane but they may also be provided on the two different portions of said ground plane.

Preferably the member further comprises or is given by a circuit board on which or in which the ground plane is provided. The circuit board may be a multi-layer circuit board wherein one conductive layer forms the ground plane.

The ground plane may host other components of the wireless device such as other electronic parts, a frequency generator/receiver for the wireless operation, other integrated circuits, a battery, a key pad, a speaker, a camera, a display, a vibrator, etc.

The ground plane is not necessarily "plane" since it may also be curved, bent or provided with steps. Sometimes, instead of to a ground plane, it is also referred to a ground counterpoise, which refers to the same.

The electric component preferably is or comprises a surface mount device. In fabrication technologies of wireless devices, surface mounting of devices is common and, therefore, in the production of the members for wireless devices surface mount technology is highly favorable.

The electric component, however, may also be or comprise a bonding wire. This is suitable, in particular, for providing a short circuit element or a good electric connection between two other electric components used for tuning the electrical ground plane properties.

The wireless device of the present invention comprises a member as mentioned beforehand. In that wireless device in general one or more pair of connecting means may be connected by an electric component. It is, however, also possible, that none of the connecting means is connected to an electric component in case that the ground plane fits with the electrical requirements without any electric component.

In general some of the connecting means and in particular the majority thereof are unconnected since they only provide for the possibility to connect an electric component but in general there will be many connecting means a few of which are chosen from for connection, while a larger number will be left unconnected, since a connection thereof does not provide for the desired electrical characteristic of the ground plane.

Alternatively, the present invention consists of a wireless device (such as for instance a mobile phone, a smartphone, a PDA, an MP3 player, headset, USB dongle, laptop, PCMCIA or Cardbus 32 card) including a reconfigurable ground-plane. This is achieved by interconnecting an electric component with at least two portions of the conducting surface of said ground-plane. Usually, the interconnection is preferably made between two portions of the ground-plane, said portions being separated by a gap or a slot on the conducting surface of said ground-plane. Said component modifies the radiation frequency response of said slot and the combination of said slot with said electric component modifies the electromagnetic and radiation frequency response of the antenna system and therefore of the entire wireless device.

Another aspect of the invention refers to the above-described reconfigurable ground-plane for a wireless device.

Such a general electric component, is for instance chosen from the following set: a resistor, a short circuit element, a capacitor, an inductor, a filter, a diode, a transistor, a switch or other kind of radio frequency devices. Any combination of them is possible.

Generally, the ground-plane within said wireless device can include more than one gap or slot separating totally or partially several grounding areas on said ground-plane. One or more electric components can be placed in one or more of said slots in said ground-plane.

In some embodiments, the present invention is used to enhance the radiation characteristics of the wireless device. For instance, the slot length can be tuned to resonate at a desired wavelength, such radiation is enhanced around such a particular wavelength. This can be used to increase the number of operating frequency bands of the wireless device, to increase the bandwidth of one or more of the bands, or a combination of both effects. When no component is applied, typically the slot will resonate at an odd multiple of a quarter wavelength (if the slot is opened at one tip and shorted at the opposite one), or at a multiple of half a wavelength (if the slot has both ends shorted or opened with respect to the ground-plane). By introducing an electric component according to the present invention, this behavior can be modified. In particular, the following effects, or a combination of them can be obtained in several arrangements:

EMBODIMENT 1

The component is a short circuit (or a low resistance component) e.g. interconnecting opposite edges of the slot. The effect is that the slot becomes electrically shorter and the resonance frequency of the slot is changed, typically to shorter wavelengths (higher frequencies).

EMBODIMENT 2

The component is a capacitor e.g. interconnecting opposite edges of the slot. Such a capacitor will have a frequency selective behavior, shorting both edges at a desired operating frequency. As a result, the slot will change its resonant frequency and/or introduce a new non-harmonic resonance that might be used to tune multiple frequency bands in the wireless device. Also, a bandwidth enhancement at a particular frequency band can be obtained by combining the natural resonance of the unloaded slot (a slot without any electric component), and the reactive response of the electric component. This arrangement can be used advantageously for a shortened length of the slot in case of space constraints on the PCB.

EMBODIMENT 3

The component is an inductor e.g. interconnecting opposite edges of the slot. Such an inductor will have a frequency selective behavior, shorting both edges at a desired operating frequency. As a result, the slot will change its resonant frequency and/or introduce a new non-harmonic resonance that might be used to tune multiple frequency bands in the wireless device. Also, a bandwidth enhancement at a particular frequency band can be obtained by combining the natural resonance of the unloaded slot, and the reactive response of the electric component. This arrangement can be used advantageously for a shortened length of the slot in case of space constraints on the PCB.

EMBODIMENT 4

The component is a filter e.g. interconnecting opposite edges of the slot. Such a filter will allow some frequencies to cross over the slot while rejecting others. As a result, the slot will change its resonant frequency and/or introduce a new non-harmonic resonance that might be used to tune multiple frequency bands in the wireless device. Also, a bandwidth enhancement at a particular frequency band can be obtained by combining the natural resonance of the unloaded slot, and the reactive response of the electric component. This arrangement can be used advantageously for a shortened length of the slot in case of space constraints on the PCB.

EMBODIMENT 5

The component is a switch, a diode (such as for instance a PIN diode, a shotky diode) or a transistor that can be for instance used to switch on and off the connection between the two portions such as the two opposite edges of the slot. Again, this can be used to switch on and off some of the resonance frequencies of the slot, which in combination with the shape of the ground plane and the radiating elements (such as for instance antenna elements) placed over or coupled to such a ground-plane, can modify the frequency response (number of bands, bandwidth, impedance matching characteristics) of the wireless device. Commutation or combination of transmitted and/or received multiple radio signals can be obtained this way.

The switch or transistor can be connected to an electronic processor of the wireless device which can select the desired electric characteristic of the ground plane.

The components and effects mentioned in the above embodiments can be combined in any way.

EMBODIMENT 6

In a preferred embodiment, which may be combined with any of the above embodiments, at least one of the slots in such a ground-plane will include one or more pads grounded at one or more of the edges of said slot, in such a way an electrical/electronic/RF component can be placed over the slot and interconnecting both sides of the slot. In other embodiments, the wireless device includes more than one of those pads or pair of pads around the slot, such that the optimum placement of the component can be tested and fixed without changing the prototyping and manufacturing of the PCB.

This is an example of a PCB in a wireless device including several grounded pads around the slot area. At least one electric component (such as for instance a surface mounted device, SMD) may connect two pads, one of those pads placed on one side and the other on the other side. The component can be generally any electric component, but preferably is chosen from the examples described in embodiments one through five (for instance resistor, a short circuit element, a capacitor, an inductor, a filter, a diode, a transistor, a switch or other kind of radio frequency devices). The electric component or components can be flexibly mounted in any of the pre-fixed pads until the desired frequency response and radiation characteristics of the wireless device are obtained. Some additional feeding pads for an antenna device may be provided (for instance a short and a feeding pad for a PIFA antenna are shown in FIG. 5 without any limiting purpose).

EMBODIMENT 7

In other embodiments, more than one component is connected to the slot. For instance, those components can be connected in a serial or cascading connection and/or, in parallel, through a pair or multiple pads. This applies to any of the components mentioned above, in particular to the components of the above described embodiments.

EMBODIMENT 8

In this embodiment, which can be combined with any of the above embodiments, the slot in the ground-plane is coupled to an antenna device. Although the antenna can be any type of antenna (a monopole, a dipole, a patch, a dielectric antenna or alike), usually a patch antenna, and more specifically a planar inverted F antenna (PIFA) will be preferred. Although the slot can be placed generally in any place of the PCB, preferably it will be placed substantially close to the antenna element such that the electromagnetic coupling between slot and antenna element is enhanced. In a preferred embodiment the slot will be placed under the antenna. In another embodiment, the slot will be placed substantially aligned with at least one of the edges of the antenna. A reconfigurable wireless device with a reconfigurable antenna+ground-plane set is obtained by placing one or more pads close to the edge of such at least one slot.

BRIEF DESCRIPTION OF THE DRAWINGS

A more complete understanding of the cushion of the present invention may be obtained by reference to the following Detailed Description, when taken in conjunction with the accompanying Drawings, wherein:

The attached drawings comprise the following figures:

FIG. 3 shows different configurations of slots and connecting means;

FIG. 4 shows a preferred embodiment of the member for a wireless device;

FIG. 5. shows a PCB and a reconfigurable slot (Embodiment 6). The PCB can be tested with the component placed in the several positions to decide which is the optimum position for the desired radio frequency response;

FIG. 6 shows a PCB of a wireless device and a reconfigurable slot (Embodiment 7). In this particular example, two SMD components are cascaded to interconnect two pads at opposite edges of the slot. For instance this can be an inductor and a capacitor, to make a serial LC filter or resonator;

DETAILED DESCRIPTION OF ILLUSTRATIVE EMBODIMENTS OF THE INVENTION

Various embodiments of the present invention will now be described more fully with reference to the accompanying drawings. The invention may, however, be embodied in many different forms and should not be construed as limited to the embodiments set forth herein; rather, the embodiments are provided so that this disclosure will be thorough and complete, and will fully convey the scope of the invention to those skilled in the art.

Figure 1A:
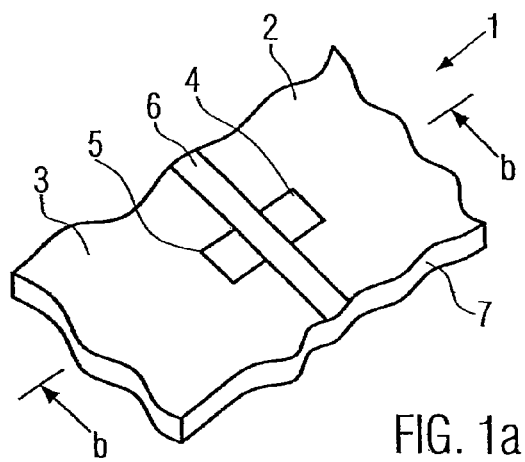
FIG. 1 shows a member 1 for a wireless device.

FIG. 1a shows in a three dimensional schematic diagram a part of a member 1 for a wireless device. The member 1 comprises two conducting layers 2, 3 which form two conducting portions of the ground plane. Those two portions are separated by a slot 6 where no conducting layer is provided. The conducting layers 2, 3 are provided on a PCB board 7.

Figure 1B:
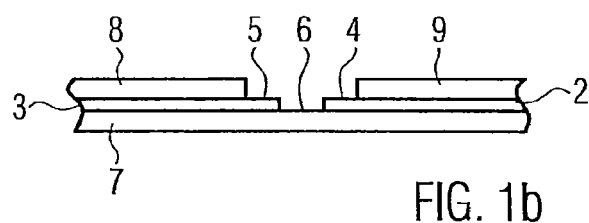

On the two sides of the slot 6, contact pads 4, 5 are provided. They are in such an opposite relation that they can be interconnected with an electric component which is oriented essentially perpendicular to the slot 6 at the location between the two connecting means 4, 5. A cut section along line bb of FIG. 1a is shown in FIG. 1b. On the circuit board substrate 7, which may be a conventional circuit board, two conducting layers 2, 3 are provided which are separated by a slot 6. Those conducting layers 2, 3 are each covered partially by an insulating material 8, 9, respectively. The insulating materials 8, 9 do not cover entirely the portions 2, 3 and some part of the portions 2, 3 are left blank. Those parts are one example of the contact pads 4, 5 as shown in FIG. 1a.

The outer shape of the member 1 is not shown in FIG. 1a since the outer shape may essentially be any shape. It may be rectangular, circular, elliptic, irregularly shaped or any other shape. Usually it will be adapted to the shape of the wireless device.

Figure 2A:
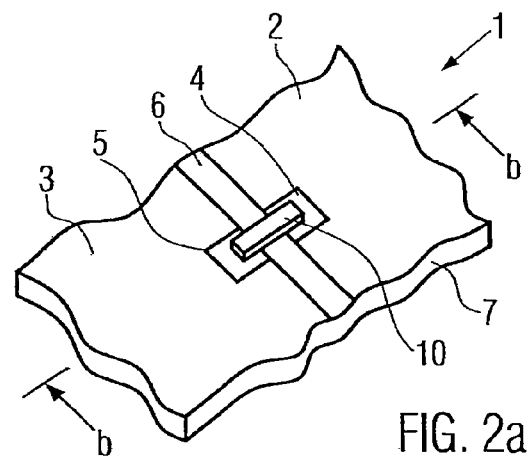
FIG. 2 shows the combination of the member for a wireless device and an electric component.
Figure 2B:
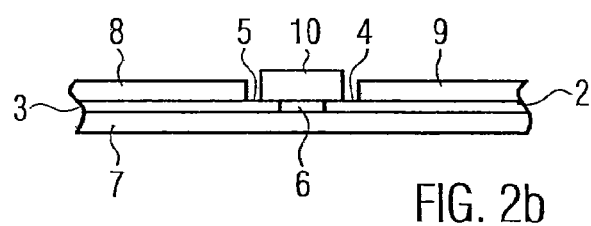

FIG. 2 shows the member 1 of FIG. 1 where an electric component 10 is added. As can be seen in FIG. 2a and FIG. 2b, this component bridges the slot 6 and is connected to the two pads 4, 5 thereby connecting the two ground plane portions 2, 3. The electric connection between each pad and the electric component may be established by solder.

In FIGS. 1 and 2, the two pads 4, 5 are provided on the edge of the slot 6. However, some insulating material may also be provided directly at the edge of the slot 6 such that the contact pads 4, 5 are provided at a certain distance from the slot 6. However they should not be further away from the slot 6 than e.g. the size of the pad 4, 5 or of the slot in a direction perpendicular to the slot 6. When providing the slot with connecting means at both sides, the manufacturing process itself may impose manufacturing tolerances that may not make possible and/or convenient to arrange them closer than a certain distance d.

FIG. 3 shows schematic views of alternative formations of the slot.

In FIG. 3a, the slot 6 is shown which only partially penetrates into the ground plane. The portion 12 of the ground plane is provided which connects the portions 2 and 3 which are separated by the slot 6.

In FIG. 3a, at least one end of the slot 6 coincides with the end of the ground plane 2, 3 (see FIG. 3a bottom). The slot depicted in FIG. 3a features an open end and a closed end. The slot may also be provided entirely within the ground plane which means that the slot is surrounded by the ground plane at all ends of the slot, and therefore the slot 6 has at least two closed ends.

In FIG. 3b it is shown that the slot is not necessarily straight but may also be bent or curved.

In FIG. 3c, it is shown that the width of the slot 6 may be non-uniform due to the protrudence or protrusion of one ground plane portion 3. Independent of the protrusions or the non-uniform width of the slot this Fig. also shows an example where the connecting means 4a, 4b, 4c and 5a, 5b, 5c are spaced at different spacing along the slot since e.g. connecting means 4b and 4c are closer together than 4a and 4b.

In FIG. 3d it is shown that the ground plane portions 2, 3 on both sides of the slot 6 may have protrusions. Preferably, those protrusions are opposite to each other. They may, however, also be offset along the slot 6.

The pads 4a, 4b, 4c, 5a, 5b, 5c are provided on those protrusions. In this way, the pads are provided at narrow portions of the slot 6.

In FIG. 3e, the case is shown where the slot has a curved edge which is not composed by straight lines. Here the pads 4a, 4b, 5a, 5b are also provided at the narrow portions of the slot 6. They may, however, also be provided at wider portions of the slot 6 (the same applies to FIGS. 3c and 3d).

In FIG. 3f two elongated connecting means 4,5 are shown which extend along the slot 6. They have a length of more than half of the length of the slot 6. On such connecting means the electric component(s) may be placed anywhere such that a continuous fine tuning of the electric characteristics is possible by choosing the location of the electric component freely along the length of the connecting means.

In FIG. 3g the case is shown where the two connecting means 4, 5 are given by two portions of a continuous connecting means, which are provided on two different sides of the slot 6 or gap. The connecting means 4, 5 extends around the end of the slot 6 (in FIG. 3g the upper end).

In FIG. 4, a particular case of a slot 6 is shown where at least some of the contact pads are provided in corners formed by the slot 6. As can be seen in FIG. 4, the contact pads 13 and 18 are in corners. The contact pad 16 is provided at the end of a protrusion of the ground plane portion 2. With this configuration, an electric component may be located e.g. connecting the pad 16 with the pad 13, 15 or 18. The spacing between the pad 16 relative to the pad 13, 15 and 18 is always the same such that electric components with the same size can be located at any of those possible three combinations. Also, it would be possible to connect pad 13 with pad 16 and at the same time connect pad 16 with pad 15 or 18 with another device. Pad 13 may alternatively also be connected with an electric component 20 (dashed line) with pad 14. As an example only, an electric component 19 is provided in order to connect pad 16 and pad 18.

The example of FIG. 4 shows that with 6 pads (13 to 18), 5 different possible connections between pads on different sides of slot 6 are possible. In general therefore, the pads may be arranged in such a way that one pad on one side of the slot may be connected to at least two or three other pads on the other side of the slot with identical components.

In the following figures the ground plane shapes have an outer shape of a rectangle, as an example only.

FIG. 5 shows a special case of a ground plane 2, 3 where a slot is provided with one end at one edge of the ground plane (open end) and terminates with another end within the ground plane (closed end). The two portions 2, 3 are therefore connected by a portion of the ground plane.

Portions 2, 3 each are provided with a multiple number of pads, where in FIG. 5, as an example, each side is provided with seven pads. All the pads are located on or close to the edge of the slot 6. The number of pads on both sides of the slot here is equal. The number may, however, also be different.

Between pads opposite to each other across the slot 6, an electric component 10 may be provided bridging the slot 6.

Depending on the pads which are interconnected by the component 10, the slot in the ground plane and thus the slotted ground plane will have different electric characteristics. As explained above, by connecting different pads on each side of the slot 6, different electric characteristics can be achieved.

On one portion 2 of the ground plane, a short connection (pad) 21 and a feeding connection (pad) 22 is provided. The feeding connection is provided for connecting the antenna radiating element to a high frequency generator/receiver and the grounding connection (pad) is provided in order to ground a portion of the antenna radiating element with the ground plane. This may be useful for IFA or PIFA antennas. The position of the connections 21 and 22 may be interchanged. Further they may be positioned closer to or in the middle of the upper end of the ground plane portion 2 or closer to the opposite upper end (upper left corner in FIG. 5).

In FIG. 6, a case is shown where two electric components 10a, 10b are connected in series in order to connect two pads 4, 5 each of which is provided on a portion 2, 3 of the ground plane.

Figure 7:
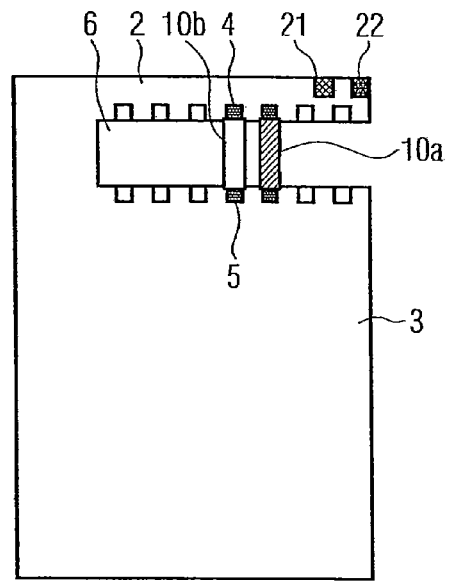
FIG. 7 shows a PCB of a wireless device and a reconfigurable slot (Embodiment 7). In this particular example, two SMD components are mounted in parallel to interconnect the two opposite edges of the slot. For instance this can be an inductor and a capacitor, to make a shunt LC filter or resonator.

In FIG. 7, the case is shown where two electric components 10a, 10b are provided in parallel in order to connect the two portions 2, 3 of the ground plane across the slot 6.

Figure 8A:
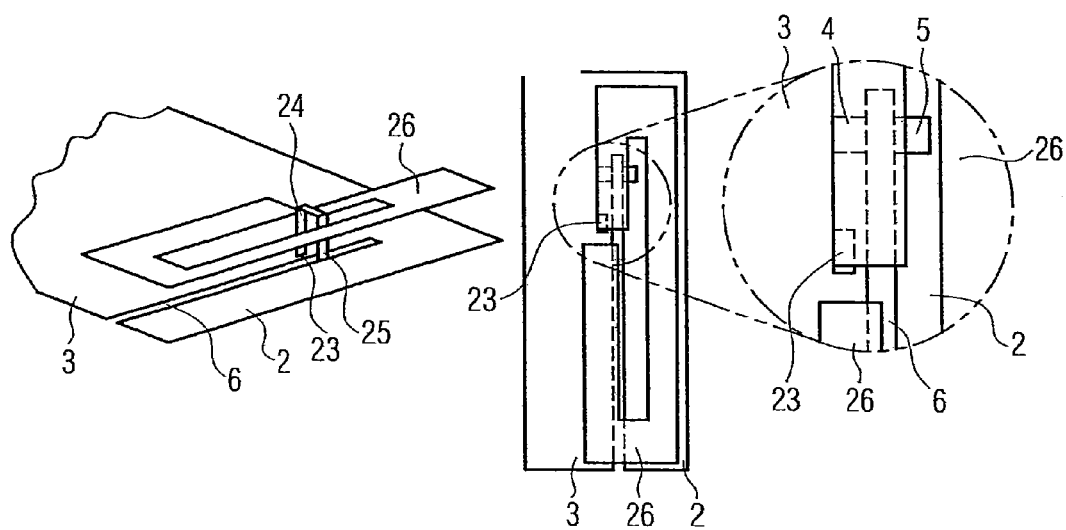
FIG. 8 shows a reconfigurable slot in a ground-plane coupled to a PIFA antenna device.

In FIG. 8a the configuration of the ground plane in combination with an antenna is shown.

The antenna element 26 is provided at a certain distance from the ground plane 2, 3. Further, the antenna element 26 is provided close to an edge of the ground plane. The slot 6 is provided close to the same edge. In this way, the antenna element and the slot 6 are close together which allows for a good electromagnetic coupling.

The antenna element 26 is connected with one terminal 24 to one portion 3 and with another terminal 25 to another portion 2 of the ground plane. The terminal 24 is connected to the feeding pad 23 and the other terminal 25 is grounded to the ground plane.

The slot 6 of the ground plane may act as an antenna. This slot antenna and the antenna element 26 may both be excited by the same feeding connection 23.

Figure 8B:
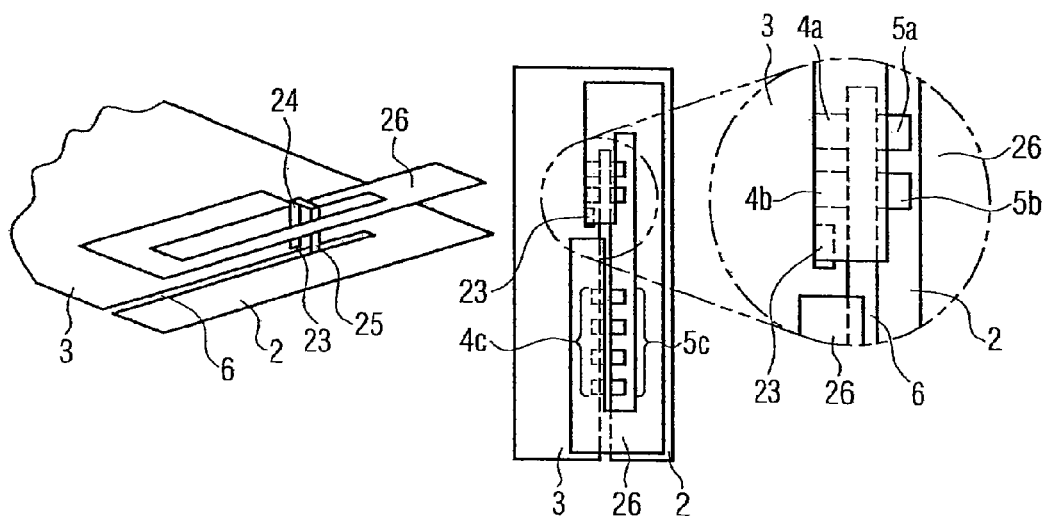

As shown in FIG. 8b additionally a number of connecting means 4a, 4b, 4c, 5a, 5b, 5c (connecting pads) are provided so that the radiating characteristics of the slot can be adjusted.

The views in the middle and on the right hand side of FIGS. 8a and 8b show a view perpendicular onto the ground plane and the slot 6. The antenna element 26 is located in front of that slot 6. The lines covered by the antenna element 26 are shown in dashed lines. Further the location of the connecting means (grounded pads) 4, 5 are shown. The antenna element 26 and the connecting means 4, 5 are provided on the same side (before/behind) of the ground plane.

In general, however, the connecting means 4, 5 and the antenna element 26 may be provided on opposite sides (before/behind) of the ground plane 2, 3.

Figure 9A:
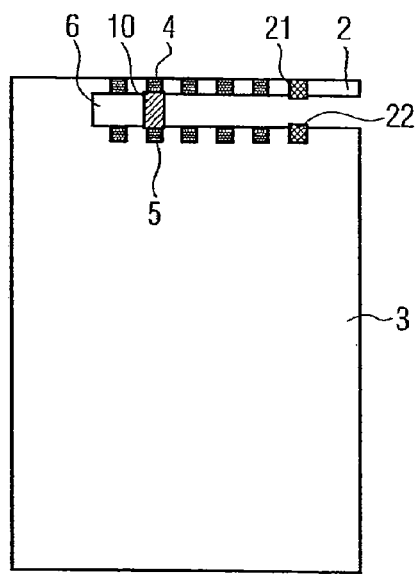
FIG. 9a shows a reconfigurable slot in a ground-plane coupled to a PIFA antenna device. Short and feeding pads of the antenna are placed at opposite sides of the slot.

In FIG. 9a, the case is shown where the feeding connection 22 and the ground connection 21 are provided on different sides of the slot 6. This means that they are provided on different portions 2, 3 of the ground plane. In this case the slot may be the antenna itself. No additional radiating element may be required. Nevertheless a further antenna element may be provided in order to have further operating frequencies available or to improve the radiation characteristics of the combination of the slot and the antenna element.

Figure 9B:
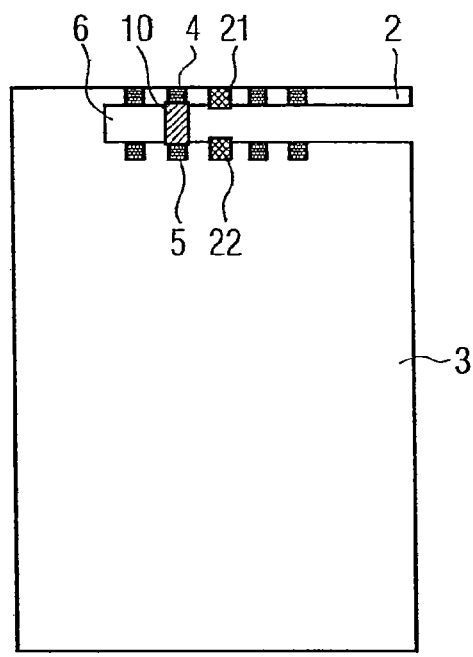
FIG. 9b shows the reconfigurable slot in a ground-plane in particular useful for cases without a separate antenna element, where the slot acts as an antenna.

As shown in FIG. 9b the feeding connection 22 and/or the ground connection 21 can be placed between connecting means 4, 5 in a direction along the slot. This arrangement can be in particular useful, when no separate antenna element is provided and the slot 6 acts as an antenna. As shown in the arrangement in FIG. 9a the feeding connection 22 and/or ground connection 21 may nevertheless also be provided on one side (in a direction along the slot) of the connecting means 4, 5 only.

In general the feeding connection 22 and/or the ground connection 21 may be placed close to an end of the slot (in particular a closed end), at the middle of the slot or spaced from the end of a slot by a third or fourth part of the length of the slot along the slot or within any interval of those values.

As shown in FIGS. 8 and 9 the feeding connection 22, 23 is preferably placed on the portion 3 of the ground plane that is larger than the other portion 2, since on this larger portion the frequency generator/receiver (not shown) may be placed conveniently and may such be placed very close to the feeding connection 22, 23. The feeding connection 22, 23 and/or the ground connection may nevertheless also be provided on the other portion 2, 3 in comparison to FIGS. 8 and 9.

In any of the above shown examples, the slot 6 itself may function as an antenna. The slot has a characteristic length which allows the slot to resonate at a resonance frequency. Therefore it is not always necessary that a separate antenna element is provided.

Figure 10:
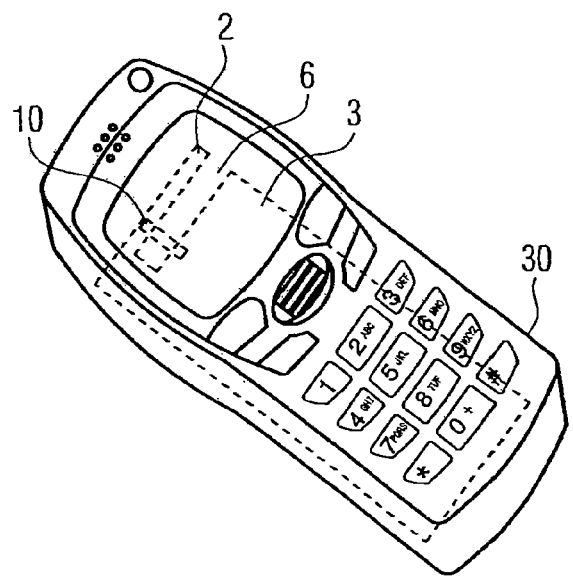
FIG. 10 shows a wireless device (here a mobile telephone) in combination with a member for a wireless device.

In FIG. 10, a mobile phone (also called a cellular phone) 30 is shown. Within that cellular telephone, which here represents any wireless device, a member with two ground plane portions 2, 3, a slot 6 and an electric component 10 bridging the slot 6 is shown.

In a preferred arrangement, the antenna is a PIFA antenna, with one short (direct electric contact between the antenna element and the ground plane) at one edge of the slot and the feeding point at the opposite edge. This enables a combined excitation of both the slot and the antenna, such that a broadband, multiband or combination of both effects is obtained. Such an arrangement becomes also useful to match the impedance of the antenna at one or more frequency bands.

In some embodiments, the slot can be excited with one or more spring contacts or metallic bridges crossing over the slot, which means, that the a spring contact is used to establish an electric connection through which feeding is carried out. By placing several pads at opposite sides of the slot according to the present invention, an adjustment of the optimum slot excitation can be obtained without changing the layout of the PCB.

Generally, the present invention can be arranged inside several kinds of wireless devices to enhance its radiation characteristics. A multiband, multi systems device with enhanced performance (bandwidth, number of bands, radiation efficiency, sensitivity, gain) is obtained. In some preferred embodiments the wireless device is operating at one, two, three or more of the following communication and connectivity services: GSM850, GSM900, GSM1800, PCS1900, GSM450, UMTS, WCDMA, CDMA, Bluetooth, WLAN, WiFi, UWB, ZigBee, GPS, Galileo, SDARs, XDARS, WiMAX.

It should be stressed that the slot does not necessarily need to have a linear shape with a constant width. Other forms such as space-filling curves as described in the PCT publication WO 0154225, fractal, or multilevel structures as described in the PCT publication WO 0122528 are possible within this invention. Non-uniform width slots are possible as well. In the case of non-uniform width slots, the component or components will be preferably placed in those regions where the distance between opposite edges of the slot is minimum.

The ground-plane can feature generally any shape, such as a space-filling (see for instance WO 0154225), a multilevel (see for instance WO 0122528), a polygonal, conformal or fractal shape.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed:

1. A handheld wireless device comprising:
   an antenna system comprising a substantially rectangular printed circuit board including a ground plane having a first portion, a second portion, and a third portion;
   the first portion and the second portion defines a slot therebetween;
   the first portion and the second portion are connected through the ground plane itself by the third portion;
   at least one feeding means is arranged in a vicinity of the slot to drive the slot; and
   a set of connecting means are arranged with respect to the slot so as to define a plurality of locations in the vicinity of the slot on which at least one electrical component can be placed to modify the electromagnetic behavior of the antenna system to provide operation in at least two frequency bands.

2. The handheld wireless device of claim 1, wherein the ground plane can be inscribed in a rectangular area having a long edge and wherein the slot is placed substantially close to a center of said long edge.

3. The handheld wireless device of claim 1, wherein the ground plane can be inscribed in a rectangular area having a short edge and wherein the slot is placed substantially close to a center of said short edge.

4. The handheld wireless device of claim 1, wherein the slot can be inscribed in a rectangular area having a longest dimension smaller than a tenth of a wavelength at a lowest frequency of operation of the antenna system.

5. The handheld wireless device of claim 4, wherein a matching network comprising at least one electrical component is provided in the set of connecting means.

6. The handheld wireless device of claim 5, wherein the antenna system operates in at least three communication standards selected from the group comprising:
   LTE700, GSM850, GSM900, GSM1800, PCS1900, UMTS, WCDMA, CDMA, LTE2100, LTE2300, LTE2500 Bluetooth, WLAN, WiFi, UWB, ZigBee, GPS, Galileo or WiMAX.

7. The handheld wireless device of claim 1, wherein the slot can be inscribed in a rectangular area having a longest dimension substantially parallel to a shortest edge of the substantially rectangular printed circuit board.

8. The handheld wireless device of claim 1, wherein at least one connecting means of the set of connecting means is disposed between the first portion and the second portion of the ground plane.

9. A handheld wireless device comprising:
   a substantially rectangular printed circuit board including a ground plane;
   a first radiating element operating in cooperation with the ground plane;
   a second radiating element operating in cooperation with the ground plane;
   the substantially rectangular printed circuit board includes a plurality of shorting means connected to the ground plane and at least a first feeding means and a second feeding means;

said at least first feeding means couples electromagnetic signals to the first radiating element and the second feeding means couples electromagnetic signals to the second radiating element;

said plurality of shorting means, the first feeding means, and the second feeding means are provided substantially close to a side of the substantially rectangular printed circuit board; and the first radiating element operates in at least two frequency bands and the second radiating element operates in at least one frequency band.

10. The handheld wireless device according to claim 9, wherein the side is a shortest side of the substantially rectangular printed circuit board and wherein the first and the second radiating elements are arranged substantially close to said shortest side of the substantially rectangular printed circuit board.

11. The handheld wireless device according to claim 9, wherein the side is a longest side of the substantially rectangular printed circuit board and wherein the first and the second radiating elements are arranged substantially close to said longest side of the substantially rectangular printed circuit board.

12. The handheld wireless device of claim 9, wherein the first radiating element comprises at least one shorting point and wherein the at least one shorting point is connected to at least one of the plurality of shorting means to establish electrical contact between said first radiating element and the ground plane.

13. The handheld wireless device of claim 12, wherein the ground plane comprises at least two portions separated by a slot or a gap.

14. The handheld wireless device of claim 12, wherein the first radiating element is separated from the ground plane.

15. The handheld wireless device of claim 14, wherein the second radiating element is separated from the ground plane.

16. The handheld wireless device of claim 15, wherein each of the at least one frequency band and the at least two frequency bands is used by a communication or connectivity service.

17. The handheld wireless device of claim 16, wherein at least two of at least three communication or connectivity services are selected from the following: GSM850, GSM900, GSM1800, PCS1900, GSM450, UMTS, WCDMA, CDMA, Bluetooth, WLAN, WiFi, UWB, ZigBee, GPS, Galileo, SDARs, XDARS, and WiMAX.

18. The handheld wireless device according to claim 9, wherein the handheld wireless device is at least one of a group of wireless devices comprising a cellular phone, a mobile phone, a smart phone, a satellite phone, a multimedia terminal, personal digital assistant (PDA), a portable music player, a radio, a digital camera, a USB dongle, a wireless headset, a PCMCIA card, a personal computer, a Notebook, a pocket PC, and a tablet PC.

19. The handheld wireless device of claim 9, wherein an operating frequency of the at least one frequency band corresponds to 900 MHz, and two operating frequencies of the at least two frequency bands correspond to 1800 MHz and 1900 MHz.

20. A clamshell-type handheld wireless device comprising:

an upper housing and a lower housing hinged to one another which can be folded together into a clamshell configuration;

the lower housing enclosing a lower circuit board;

the upper housing comprising a first portion of a substantially rectangular ground plane and the lower circuit board comprising a second portion of the substantially rectangular ground plane;

the first portion and the second portion being connected by a connecting means;

the first portion and the second portion defining a slot therebetween; and wherein at least two shorting means are arranged in a vicinity of the slot to provide connection to the substantially rectangular ground plane.

* * * * *